United States Patent [19]

Dalrymple et al.

[11] Patent Number: 5,306,927
[45] Date of Patent: Apr. 26, 1994

[54] HIGH CURRENT AMPLIFIER UTILIZING A JOSEPHSON JUNCTION SCHOTTKY DIODE THREE TERMINAL DEVICE

[75] Inventors: Bruce J. Dalrymple, Redondo Beach; Arnold H. Silver, Rancho Palos Verdes; Randy W. Simon, Belmont, all of Calif.

[73] Assignee: The United States of America as represented by the Secretary of the Navy, Washington, D.C.

[21] Appl. No.: 745,315

[22] Filed: Aug. 15, 1991

[51] Int. Cl.$^5$ .......................................... H01L 39/22
[52] U.S. Cl. ........................................ 257/38; 257/31; 257/36; 257/37; 257/39; 505/832; 505/806; 505/817; 505/874
[58] Field of Search ................ 357/5; 250/336.2; 257/37, 38, 39, 36; 505/806, 817, 832, 865, 874

[56] References Cited

U.S. PATENT DOCUMENTS

| | | | |
|---|---|---|---|
| 3,906,231 | 9/1975 | Fletcher et al. | 250/336.2 |
| 4,631,423 | 12/1986 | Fans | 307/306 |
| 4,646,060 | 2/1987 | Phillips et al. | 307/277 |
| 4,672,244 | 6/1987 | Harada et al. | 307/277 |
| 4,902,908 | 2/1990 | Harada | 307/277 |
| 4,926,067 | 5/1990 | Whiteley | 307/306 |
| 4,956,642 | 9/1990 | Harada | 307/306 |
| 4,970,395 | 11/1990 | Kruse, Jr. | 250/336.2 |
| 5,012,243 | 4/1991 | Lee | 307/277 |
| 5,021,658 | 6/1991 | Bluzer | 250/336.2 |

FOREIGN PATENT DOCUMENTS 305572 12/1988 Japan ........................ 357/5

OTHER PUBLICATIONS

Y. Tazoh, "Evaluation of High-Frequency Performances of a Superconducting Base Transistor Using High-Tc Materials", IEEE Trans. on Mag., vol. 27, No. 2, Mar. 1991, pp. 3316–3319.

H. Tamura, et al., "Analysis of Superconducting-Base Transistor Characteristics", J. Appl. Phys. 60(2), Jul. 15, 1986, pp. 711–717.

Kobayashi, T. et al., "Microwave Application of Three-Terminal Josephson Device Under Hot Quasiparticle Injection," IEEE Transactions on Magnetics, vol. MAG-21, No. 2, Mar. 1985, pp. 924–927.

Sakai, S., et al., "Static Characteristic of a New Quasiparticle Injected Superconducting Weak Link Device," Electronics Letters 17, 501 (1981).

H. Tamura, et al., "Current Injection Effects in a Nb/Al/Nb/n Triode" Japanese Journal of Applied Physics, vol. 24, No. 9, Sep. 85, pp. 709–710.

Microwave Applications of Three-Terminal Josephson Device Under Hot Quasiparticle Injection IEEE Transactions on Magnetics 21, 924 (1985) T. Kobayashi, et al.

Static Characteristic of a New Quasiparticle Injected Weak Link Device, Electronic Letters 17, 501 (1981) S. Sakai, et al.

*Primary Examiner*—Andrew J. James
*Assistant Examiner*—Alice Wu Tang
*Attorney, Agent, or Firm*—James T. Busch; Alfons F. Kwitnieski; Thomas E. McDonald

[57] ABSTRACT

A high current amplifier, three terminal device, comprising a Josephson tunnel junction and a Schottky diode is configured so that the Josephson junction and Schottky diode share a common base electrode which is made very thin. Electrons which cross the Schottky barrier are supplied to the Josephson junction to obtain the amplified output current.

1 Claim, 3 Drawing Sheets

HIGH CURRENT AMPLIFIER UTILIZING A JOSEPHSON JUNCTION SCHOTTKY DIODE THREE TERMINAL DEVICE

BACKGROUND OF THE INVENTION

1. Field of the Invention

The present invention relates to a Josephson junction coupled to a Schottky diode semiconductor, and to the use of such a three terminal device as a current amplifier.

2. Description of Prior Art

A somewhat similar device has been described by S. Sakai and H. Tateno, Electronics Letters 17, 501 (Jul. 9, 1981). Their three-terminal device involves a Nb thin-film microbridge on a silicon substrate. They saw a depression in the critical current, as we did, when current was injected from the semiconductor into the superconductor. The big difference between our devices is that they used a microbridge-type Josephson device. Such a device exhibits a critical current, but does not have a junction gap voltage. This means that the biasing arrangement we have used to get high current gains is not possible with their device.

A more similar device was discussed by Kobayashi, Miura, Tonouchi, and Fujisawa, IEEE Trans. on Magnetics 21, 924 (Mar. (1985). Their device involved a Nb tunnel junction on both a GaAs and an InP semiconductor substrate. The difference between our devices is that they did not see any change in either the junction critical current or the junction gap voltage when current was injected from the semiconductor into the base electrode of the Josephson junction. To get current amplification of any sort from the device they had to irradiate it with microwaves. The I-V curve of a Josephson junction changes in a characteristic way under microwave irradiation, and they observed that the "steps" were affected by a current across the Schottky barrier. Without external microwave irradiation, no current gain was observed.

OBJECTS AND SUMMARY OF INVENTION

It is an object of the invention to couple a Josephson junction and Schottky diode together to form a three-terminal current amplifier.

When used as a current amplifier, our Schottky diode/Josephson junction three terminal device provides a large current gain, i.e., greater than 400, a modest amount of power gain, impedance transformation, and it also can be coupled to superconducting circuitry to provide additional low-noise signal processing.

DESCRIPTION OF PREFERRED EMBODIMENT

Figure 1:
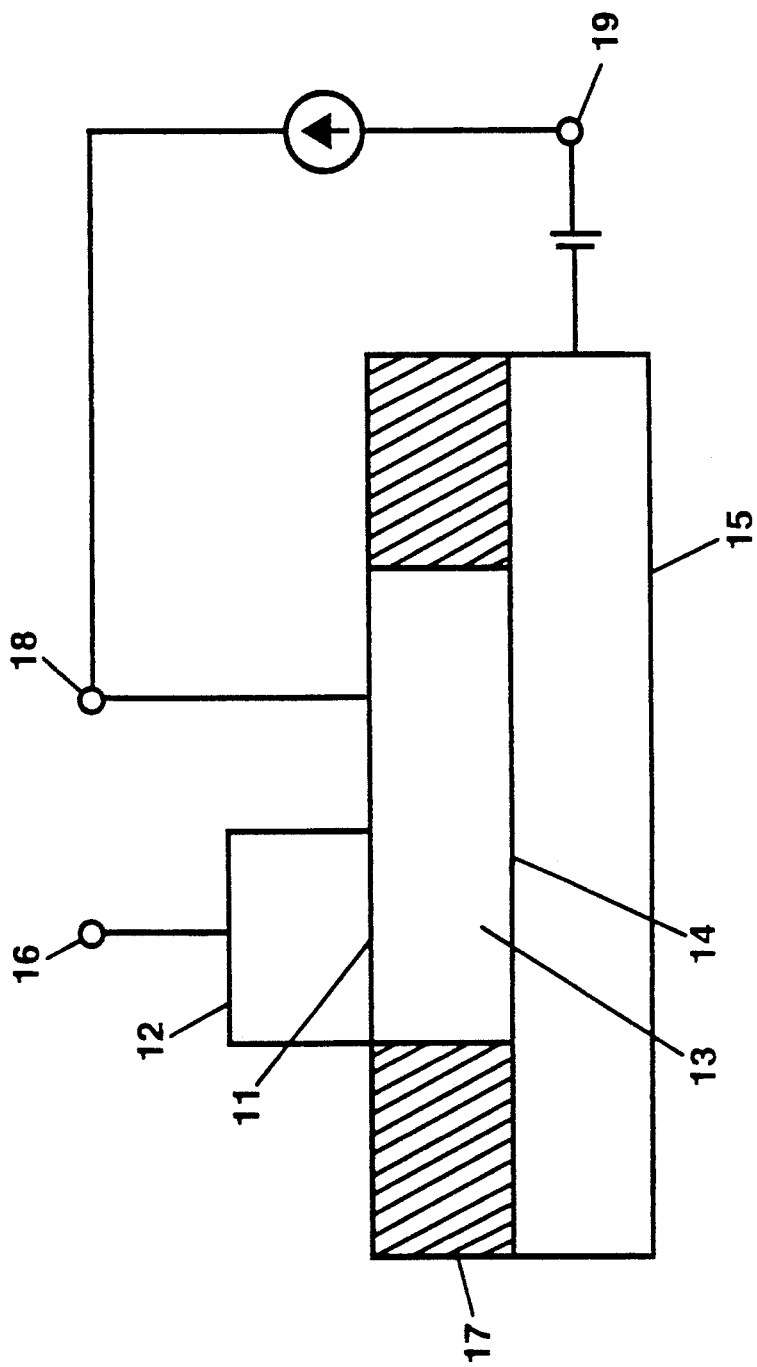
FIG. 1 shows an example of the basic structure of the current amplifier of the invention.
Figure 2:
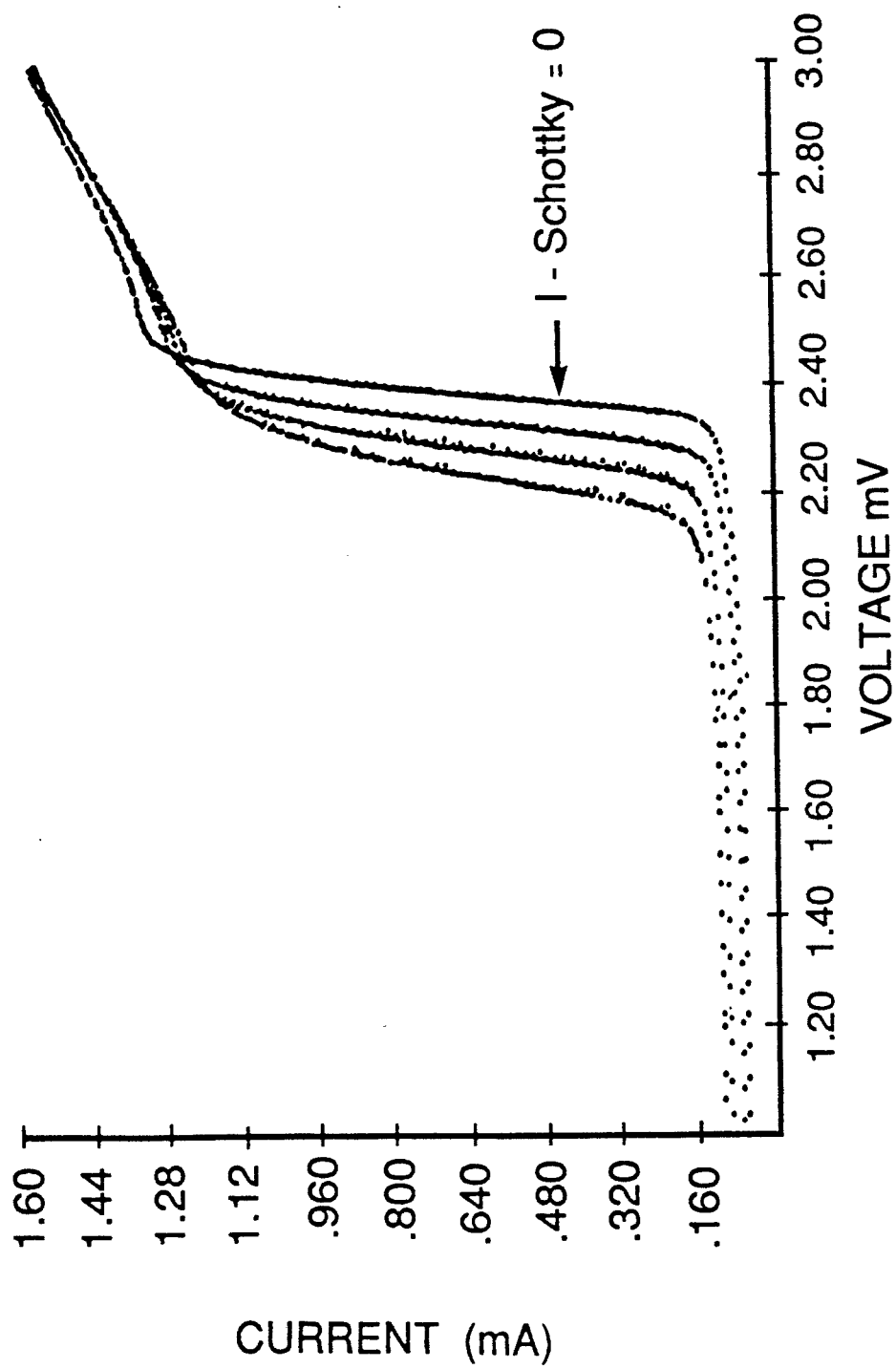
FIG. 2 shows the effects of the injected Schottky current on the Quasiparticle branch of the I-V curve.

Our invention consists of a thin-base electrode Josephson junction fabricated directly on a semiconductor substrate without an intervening oxide layer. This results in a Schottky barrier being formed at the interface between the semiconductor and the thin-base electrode. A three-terminal device results, with the current injected across the Schottky barrier into the thin-base electrode being considered the input quantity, and the properties of the Josephson junction being monitored in some fashion to provide the output. FIG. 1 shows the basic configuration of our invention. The Josephson junction 11 is comprised of an oxide layer sandwiched between metal electrode 12 and a base electrode 13 which in this instance are both niobium. The Schottky diode 14 consists of semi-conductor substrate 15 and the common metal layer 13. Insulating material 17 which can be SiO surrounds the common layer or base electrode 13. Wiring terminals 16, 18, and 19 which can be Nb are coupled to the electrodes 12 and 13 and the semiconductor substrate is respectively. The two junction properties of interest are the gap voltage and the critical current, both of of interest are the gap voltage an which are observed to change in response to the Schottky current. Both effects can be exploited to make a current amplifier. Our preferred embodiment focuses on the depression of the gap voltage as depicted in FIG. 2 where it is plotted against the Schottky current, since by voltage biasing near the gap, current gains in excess of 400 have been measured. These results were obtained with Nb junctions on n-type GaAs substrates. The Josephson junction and the Schottky diode share a common electrode 13, which is made very thin, less than 200 Angstroms. The Schottky diode 14 is biased so that electrons from the semiconductor will be injected into the thin base electrode of the tunnel junction. These energetic injected electrons create a nonequilibrium in the base electrode which perturbs the junction properties. The junction properties can then be measured. This configuration provides considerable current gain.

Figure 3:
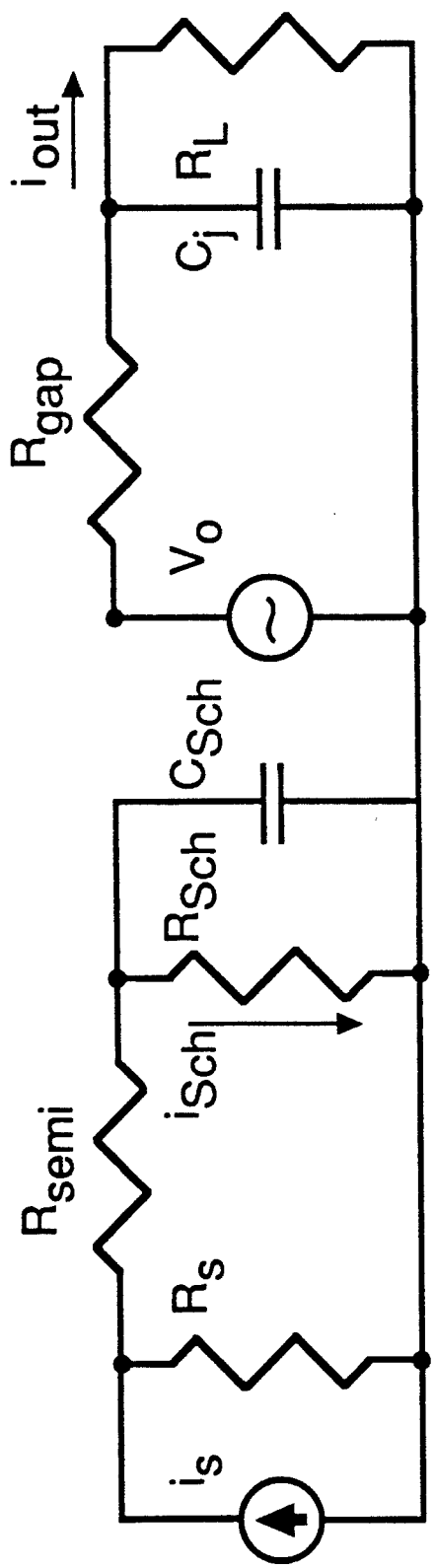
FIG. 3 is a schematic model of the basic device with the Josephson junction Schottky diode combination of the present invention.

In order to better understand the functioning and optimization of the Josephson/Schottky three terminal device, the equivalent circuit model of FIG. 3 is now referred to. In FIG. 3, $R_S$ and $i_S$ represent the source, $R_{semi}$ is the bulk resistance of the semiconductor substrate 15, $R_{SCH}$ is the dynamic resistance of the Schottky diode, $R_{GAP}$ is the dynamic resistance of the Josephson junction and $C_{JJ}$ and $C_{SCH}$ represent junction Capacitances.

The transfer relationship at low frequency is:

$$V_0 = i_{SCH} \frac{\partial V_{GAP}}{\partial I_{SCH}}$$

$$i_{OUT} = \frac{V_0}{R_{GAP} + R_L}$$

The fundamental gain mechanism in our device is the suppression of the Josephson junction gap voltage by the injected Schottky current which consists of electrons crossing the Schottky gap. As the transfer relation shows, the output current is inversely proportional to the sum of the dynamic resistance of the Josephson junction and the load resistance.

Currently, very good quality thin-base electrode tunnel junctions on GaAs which have resistances $R_{GAP}$ of about 10 milliohms can be produced. $R_{GAP}$ is the inverse of the slope of the junction I-V curve at the sharp jump in current which occurs at the gap voltage. Therefore, it is clear that our device is best suited to function as a current output amplifier with a very small load resistance. This means that it is ideally suited to be connected with a SQUID galvanometer or SQUID-based A/D converter used as the next signal processing stage.

Using a room-temperature active voltage-biasing circuit having an equivalent $R_L = 2$ milliohms, we have measured current gains over 450.

It is intended that modifications could be made within the scope of the invention. For example, it could be possible to utilize silicon substrates with MOTT barriers in place of the Schottky barrier.

We claim:

1. A three-terminal high current amplification device comprising:
   a. an input terminal;
   b. an output terminal;
   c. a common terminal;
   d. a semiconductor substrate of GaAs which is connected to the input terminal; and
   e. a Josephson junction having a first niobium electrode connected to the output terminal and a niobium base electrode connected tot eh common terminal, said base electrode having a thickness less than 200 Angstroms, and said base electrode being directly connected on said semiconductor substrate so that a Schottky barrier is formed there between; said device having a current amplification between said base electrode and the first electrode of the Josephson junction that is greater than ten.

* * * * *